United States Patent [19]
Leicht et al.

[11] Patent Number: 5,551,627
[45] Date of Patent: Sep. 3, 1996

[54] ALLOY SOLDER CONNECT ASSEMBLY AND METHOD OF CONNECTION

[75] Inventors: John L. Leicht, Hawthorn Woods; William R. Bratschun, La Grange, both of Ill.

[73] Assignee: Motorola, Inc., Schaumburg, Ill.

[21] Appl. No.: 314,833

[22] Filed: Sep. 29, 1994

[51] Int. Cl.$^6$ .............................. H05K 3/34; H01L 21/58
[52] U.S. Cl. .................. 228/180.22; 228/245; 228/56.3; 228/193; 437/183; 427/123
[58] Field of Search ........................ 228/193, 195, 228/245, 123.1, 224.1, 56.3, 180.22; 427/123; 437/183

[56] References Cited

U.S. PATENT DOCUMENTS

| | | | |
|---|---|---|---|
| 3,488,840 | 1/1970 | Hymes et al. | 437/183 |
| 4,950,623 | 8/1990 | Dishon | 228/180.22 |
| 5,060,844 | 10/1991 | Behun et al. | 228/180.22 |
| 5,106,009 | 4/1992 | Humpston et al. | 228/195 |
| 5,186,383 | 2/1993 | Melton et al. | 228/254 |
| 5,221,038 | 6/1993 | Melton et al. | 228/197 |
| 5,269,453 | 12/1993 | Melton et al. | 228/195 |
| 5,388,327 | 2/1995 | Trabucco | 228/56.3 |

OTHER PUBLICATIONS

Transactions of the Metallurgical Society of AIME, "Applications of Solid–Liquid Interdiffusion (SLID) Bonding in Integrated Circuit Fabrication", L. Bernstein and H. Bartholomew, vol. 236, Mar. 1966, pp. 405–412.

Howard H. Manko, "Solders and Soldering," 1979 by McGraw–Hill, pp. 110, 132–133.

*Primary Examiner*—Samuel M. Heinrich
*Attorney, Agent, or Firm*—Daniel W. Juffernbruch

[57] ABSTRACT

An electronic assembly (100) includes multiple solder connections (101) coupling faying surfaces (202, 204) of two substrates (106, 108). A solder connection (201) is fabricated by reflow heating of a first, less compliant solder paste (312, 314) and a compliant preform (210) so as to cause compliant material of the preform (210) to dissolve into the solder paste (312, 314). Upon solidification of the solder paste (312, 314), blended regions (520, 522), having a gradual, changing concentration of compliant material form between resulting fillets (212, 214) and the preform (210). The blended regions (520, 522) transfer temperature induced shear stresses, caused by thermal cycling of the electronic assembly (100), from the fillets (212, 214) into the compliant preform (210).

27 Claims, 3 Drawing Sheets

ALLOY SOLDER CONNECT ASSEMBLY AND METHOD OF CONNECTION

BACKGROUND OF THE INVENTION

1. Field of the Invention

The present invention relates generally to pinless connector structures and, more particularly, to solder connection structures.

2. Description of Related Art

The electronics manufacturing industry is moving away from the use of pins as a means of connecting electronic integrated circuit (IC) packages to substrates. Fabrication of progressingly small electronic components realizes input/output limitations. In addition, pin connectors have an unacceptably high failure rate. To overcome these and other quality limitations and physical limitations of IC packages and pin connectors, surface mountable solder connection structures were developed to couple the IC package to the substrate.

An IC package that utilizes surface mountable solder connection structures is referred to as a grid array package. Today, grid array packages are utilized in electronic equipment ranging from computers to telephone switches. Mounting the grid array package to the substrate requires multiple solder connection structures. An electronic assembly resulting from the attachment of the grid array package to the substrate via solder connection structures is typically manufactured as stated hereinbelow.

The solder connection structure generally consists of a ball-shaped solder portion ("ball") electrically connected between the faying surfaces of two substrates by solder fillets. Prior to attachment and creation of the solder connection structure, the solder fillets are in the form of a paste ("paste"). The ball typically has a higher melting point than the paste. The electronic assembly may be fabricated by, first, placing balls in contact with paste disposed on the faying surfaces of the grid array package and, second, applying heat above the melting point of the paste, but below the melting point of the balls. As a result, the molten paste wets or attaches the balls to the faying surfaces of the grid array package and later solidifies into fillets. The electronic assembly can then be completed by similarly disposing paste on the corresponding faying surfaces of a substrate, contacting the area of the balls opposing the grid array package to the paste, and similarly applying the required heat. The previous method as well as other manufacturing methods are more fully described in, for example, U.S. Pat. No. 5,060,844, "Interconnection Structure and Test Method" by Behun et al.

Solder connection structures have a limited life due to cumulative weakening caused by temperature induced shear stresses and strains. Solder connection structures often must attach substrates having different compositions, for example, grid array packages are typically comprised of a ceramic while printed circuit boards (PCBs) are mostly comprised of an epoxy. Because different substrates tend to expand at different rates with respect to changes in temperature, solder connection structures must be compliant to accommodate such expansions without mechanical failure. Because the electronic apparatuses that employ the solder connection structures will typically undergo temperature changes from cyclical operation, the solder connection structures must also be fatigue resistant.

Prior art solder connection structures are typically comprised of alloys containing two elements, tin and lead. The ball is comprised of about 90% lead and 10% tin. The paste and the resulting fillets are comprised of about 63% tin and 37% lead. The particular compositions of the ball and the paste are chosen because they facilitate wetting and attachment of surfaces during heating. Also, the ball and the paste components of prior art solder connection structures have similar stress-strain performance, causing them to behave as a single entity. This can be seen by comparing shear strength and tensile strength to elongation, which can be used to define compliancy (see Manko, "Solders and Soldering," 2d Edition, McGraw-Hill, pg. 132, Table 4–3).

Because prior art solder connection structures are comprised mainly of tin and lead alloys, they lack the necessary compliancy and fatigue resistance to withstand the temperature-related expansions and contractions of the substrates of an electronic assembly during the operation thereof. Therefore, what is needed is a cost-effective, manufacturable solder connection structure that is more compliant and fatigue resistant and able to withstand temperature induced shear stresses.

BRIEF DESCRIPTION OF THE DRAWINGS

FIG. I illustrates a perspective view of an electronic assembly comprising a grid array integrated circuit package mounted on a circuit board in accordance with the present invention;

FIG. 3-1 and FIG. 3-2 illustrate a method of fabricating the solder connection structure of FIG. 2;

DETAILED DESCRIPTION OF THE PREFERRED EMBODIMENTS

The present invention provides a fatigue resistant solder connection structure. The solder connection structure is comprised of a preform formed of a compliant solder alloy connectably disposed between two fillets formed of a comparatively less compliant solder alloy by a blended region having a gradual changing concentration of the preform and the two fillets. Each fillet is further attached to a faying surface of a substrate. A solder connection of the solder connection structure is fabricated by depositing a cost-effective less compliant solder paste onto the faying surface of a substrate, placing the compliant preform in contact with the paste, and heating the paste and the preform such that compliant material from the preform (not present in the solder paste) dissolves into the paste, such that the fillet resulting from the solidified paste is compositionally different with respect to the paste as initially deposited. The "sharing" of compliant material that results from the dissolution, makes the solder connection more compliant and fatigue resistant with respect to the prior art and, thus, capable of alleviating harmful applied shear stresses.

Figure 1:
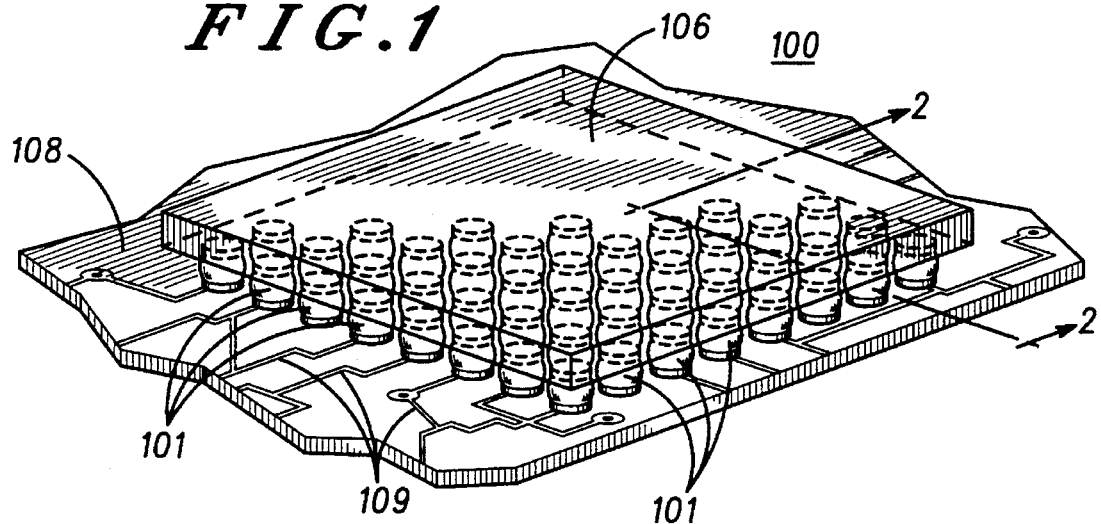

FIG. 1 illustrates a perspective view of an electronic assembly 100 comprising a grid array IC (integrated circuit) package 106 mounted on a partially shown printed circuit board 108 in accordance with the present invention. The electronic assembly 100 may comprise a portion of an electrical circuit within an electronic device, such as a computer or a telephone switch. The grid array package 106 may be any IC component that requires high density input/output, such as the ceramic ball grid array family described in JEDEC registration MO-156.

The grid array package 106 is mounted on the circuit board 108, which may be comprised of epoxy and glass fibers, by multiple solder connection structures 101. The solder connection structures 101 interconnect a two-dimensional arrangement of faying surfaces (or surface conductors) disposed on the bottom surface of the grid array package 106 with a corresponding arrangement of faying surfaces disposed on the top surface of the circuit board 108. The faying surfaces effectively couple electronic components comprising the grid array package 106 to adjacent electronic circuitry (not shown) disposed on the circuit board 108 via traces 109. Although the grid array package 106 and the circuit board 108 are illustrated in FIG. 1, it must be realized that the solder connection structures 101 can interconnect any two substrates having appropriate faying surfaces.

The multiple solder connection structures 101 must be compliant so as to be able to alleviate applied stress by straining during the operation of the electronic assembly 100. During the operation of the electronic assembly 100, thermal energy, i.e. heat, is generated. As the temperature of the electronic assembly 100 increases, both the grid array package 106 and the circuit board 108 expand. Because of different compositions, the grid array package 106 and the circuit board 108 are subject to different rates of thermal expansion. The grid array package 106, which may be comprised of a ceramic material, may expand approximately seven parts per million for every degree of centigrade that the temperature of the grid array package 106 increases. The circuit board 108, which may be comprised of epoxy and glass fibers, may expand approximately eighteen parts per million for every degree of centigrade that the temperature of the circuit board 108 increases. As the grid array package 106 and the circuit board 108 expand at different rates, stresses are imparted on the multiple solder connection structures 101.

Similarly, the multiple solder connection structures 101 must further be compliant so as to be able to elastically return from a strained condition when the electronic assembly 100 goes out of operation. Associated with the aforementioned thermal expansion is the subsequent contraction of the grid array package 106 and the circuit board 108 at different rates when the electronic assembly 100 goes out of operation and cools. As cooling occurs and the grid array package 106 and the circuit board 108 contract at a different rate and aside from returning from the strained condition attained during heating, the multiple solder connection structures 101 are also subject to additional stresses impacted throughout the contraction.

Thus, not only must the multiple solder connection structures 101 be compliant to prevent the accumulation of harmful stress levels, but also fatigue resistant to endure cyclical expansive heating and, subsequent, contractive cooling of the grid array package 106 and circuit board 108 at different rates as the electronic assembly 100 goes in and out of operation.

Figure 2:
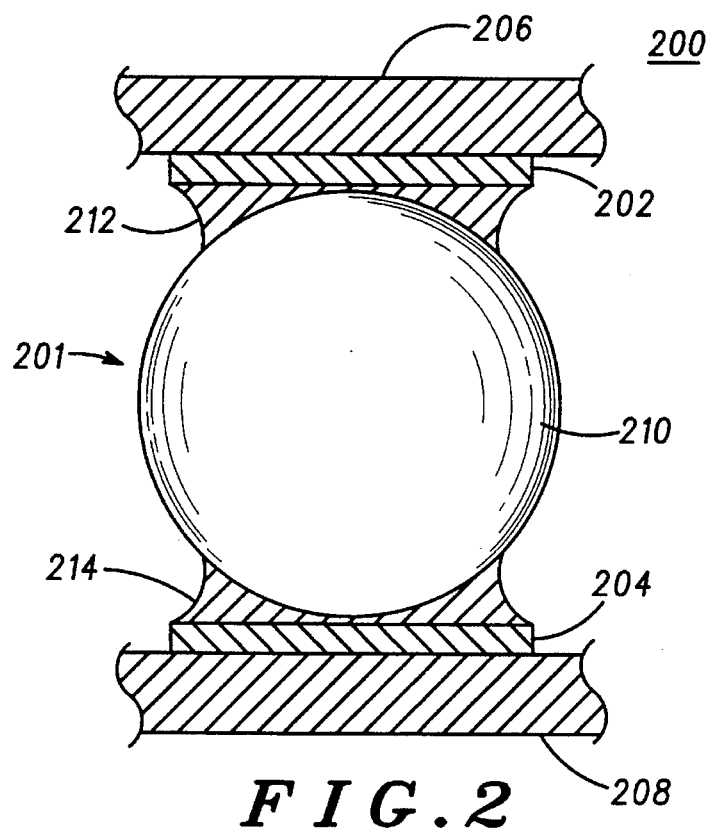
FIG. 2 illustrates a cross-sectional side view of a partial electronic assembly comprising one of the solder connection structures of the electronic assembly of FIG. 1 taken along section lines 2—2.

FIG. 2 illustrates a cross-sectional side view of a partial electronic assembly 200 comprising one of the solder connection structures 101 of the electronic assembly 100 of FIG. 1 according to the present invention. The partial electronic assembly 200 includes a portion of a grid array package 206 and a corresponding portion of a circuit board 208 having a solder connection structure 201 disposed therebetween. The solder connection structure 201 interconnects faying surfaces 202 and 204 of the grid array package 206 and the circuit board 208, respectively. In the preferred embodiment, the faying surfaces 202 and 204 may be circular, metallized pads comprised of copper, nickel, tungsten, or molybdenum. The faying surface 202 of the grid array package 206 may be plated with a material such as gold to promote conductivity. However, oftentimes, the gold plating disposed on the faying surface 202 is removed during an initial reflow heating process to promote attachment of the solder connection structure 201.

The solder connection structure 201 is comprised of a spherical preform 210. The spherical preform 210 is similar in form and function to the ball utilized in the prior art. The spherical preform 210 is constructed from a metal alloy solder. To achieve more compliance and fatigue resistance with respect to prior art, the spherical preform 210 of the present invention can contain indium rather than tin. As previously discussed, the ball of the prior art solder connection structure, utilizes tin, a less compliant material. As a result, the solder connection structure 201 of the present invention is capable of straining at lower stress levels and, thus, preventing the accumulation of harmful stress levels that lead to fatigue and failure.

The solder connection structure 201 is further comprised of a pair of fillets 212 and 214. The fillets 212 and 214 are preferably a metal alloy solder that is comparatively less compliant than the metal alloy solder that comprises the spherical preform 210. To achieve less compliance, the fillets 212 and 214 may be comprised of tin. The fillets 212 and 214 attach the spherical preform 210 to the respective faying surfaces 202 and 204. Because the fillets 212 and 214 may contain tin and are less compliant than the spherical preform 210, a brittle intermetallic layer exists between the fillets 212 and 214 and the respective faying surfaces 202 and 204.

To make the solder connection structure 201 more capable of resisting fatigue, the fillets 212 and 214 are tapered so as to focus shear stresses imparted on the solder connection structure 201 to the smallest possible cross sectional area within the solder connection structure 201 and away from the brittle intermetallic layer. The smallest possible cross-sectional area of the solder connection structure 201 (or the smallest possible diameter of the fillets 212 and 214 when the respective faying surfaces 202 and 204 are circular) is not at the brittle intermetallic layer, but rather within the fillets 212 and 214 and at or near the surface of the compliant spherical preform 210. The smallest possible cross sectional area can be realized by taking a cross section parallel to the flat surface of the respective laying surfaces 202 and 204; this cross section has an area that is less than the area of the faying surfaces 202 and 204. Therefore, when subjected to shear stresses, the solder connection structure 201 is stressed most where its cross sectional area is the smallest possible, at or near the surface of the compliant spherical preform 210 and not at the brittle intermetallic layer. As a result, the shear stresses can be safely alleviated via the straining of the compliant portion of the solder connection structure 101.

Figures 1, 3:
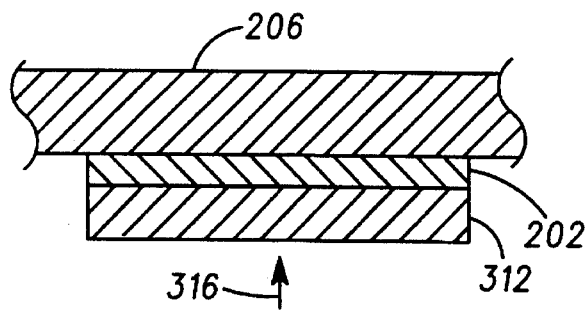
Figures 2, 3:
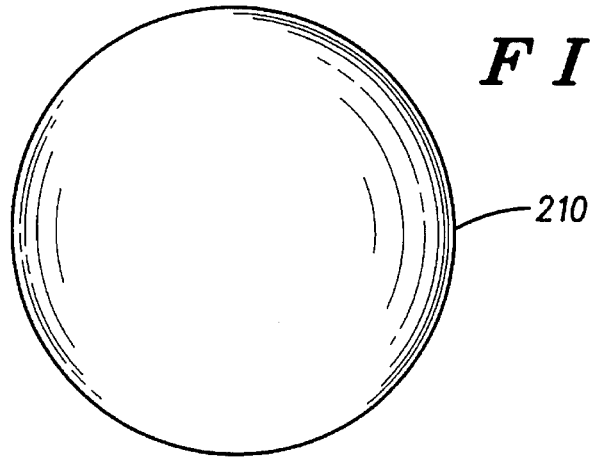

The solder connection structure 201 of FIG. 2 may be fabricated using the following process. FIG. 3-1 shows a step in a method of attaching the spherical preform 210 to the grid array package 206. Prior to solidification, the fillet 212 is in the form of a solder paste 312 comprised of a metal alloy. The solder paste 312 is deposited on the faying surface 202 of the grid array package 206. A predetermined quantity of the solder paste 312 is deposited on the faying surface 202 to ensure that the resulting solidified fillet 212 is tapered.

The spherical preform 210 is then moved in a direction shown by the arrow 316 and brought into contact with the solder paste 312. The grid array package 206-faying surface 202-solder paste 312 spherical preform 210 construction is then reflow heated by an oven, such as the Watkins Johnson convection oven Model No. 18SMD-66. Reflow heating should ramp up to a temperature above the melting point of the solder paste 312, but below the melting point of the spherical preform 210 for a period of about 15 to 60 seconds. It is necessary to heat the grid array package 206-faying surface 202-solder paste 312-spherical preform 210 construction to a temperature higher than the melting point of the solder paste 312 to prevent the solder paste 312 from prematurely cooling as it contacts the metals in the construction capable of heat dissipation. During this time period, indium from the spherical preform 210 dissolves into the solder paste 312, now in a molten state. The dissolution of indium into the solder paste 312 may be characterized as a re-alloying of the solder paste 312; that is, the solder paste 312, now containing indium, has a composition that is distinctly different from the solder paste 312 as initially deposited.

Upon cooling, the re-alloyed solder paste 312 containing indium solidifies into the fillet 212. The solder paste 312, while homogeneous when melted, is now likely to resemble a multiphase mixture when solidified into the fillet 212. The fillet 212 comprises a gradual, changing combination of the material from the spherical preform 210 and the solder paste 312 as better illustrated in FIG. 5.

FIG. 3-2 shows a step in a method of attaching the spherical preform 210 to the circuit board 208. The method is similar to the method described in association with FIG. 3-1. A predetermined quantity of a solder paste 314, similar in composition to the solder paste 312, is disposed on the faying surface 204 of the circuit board 208. The portion of the spherical preform 210 opposite the grid array package 206 is then moved in a direction described by the arrow 318 and brought into contact with the solder paste 314. Next, the spherical preform 210 and the solder paste 314 are reflow heated. The solder connection structure 201 of FIG. 2 results from the aforementioned method steps. It should be noted that the solder connection structure 201 could be fabricated by reversing the order of the method steps illustrated by FIGS. 3-1 and 3-2; that is, the circuit board 208 could be attached to the spherical preform 210 prior to the attachment of the grid array package 206.

The fabrication of the electronic assembly 100 of FIG. 1 can be accomplished by expanding the aforementioned process steps to account for multiple parallel connections by the multiple solder connection structures 101. First, a solder paste, such as solder paste 312, may be screen printed onto the two-dimensional arrangement of faying surfaces of the grid array package 106 by using a metering stencil. Next, spherical preforms, such as spherical preform 210, may be placed in contact with and oriented to the faying surfaces with a template, preferably comprised of aluminum. The partially constructed electronic assembly is then reflow heated as previously described and, subsequently, allowed to solidify. Next, a solder paste, such as solder paste 314, may be screen printed onto the corresponding two-dimensional arrangement of laying surfaces disposed on the circuit board 108. The spherical preforms extending from the faying surfaces of the grid array package 106 are then brought into contact with the corresponding faying surfaces of the circuit board 108 and reflow heated and, subsequently, allowed to solidify. Once connected via the aforementioned steps, the grid array package 106 may operate in conjunction with other components in the electric circuit formed upon the circuit board 108.

Various factors must be considered when determining which alloys are capable of comprising the spherical preform 210 and the solder paste 312 and 314 such that the solder connection structure 201 of FIG. 2 can be fabricated via the aforementioned method steps of FIGS. 3-1 and 3-2. The factors include, but are not limited to, compliancy and fatigue resistance, melting point considerations, and manufacturability as well as cost. In addition, the alloys must be solderable such that the solder paste 312 and 314 is capable of wetting to both the spherical preform 210 and the faying surfaces 202 and 204.

To achieve compliancy and fatigue resistance, the spherical preform 210 of the solder connection structure 201 should be comprised of a compliant alloy that is capable of straining at low stresses. This compliancy is exhibited by simple alloys of indium, which are typically characterized by a high level of elongation at failure stress (see Manko, "Solders and Soldering," Table 4–3). These simple alloys of indium preferably include those comprised of between about 3 and 50 percent weight percent indium and the balance lead. Specific examples include alloys comprised of about 95% lead and 5% indium, about 90% lead and 10% indium, about 81% lead and 19% indium, about 75% lead and 25% indium, and about 50% lead and 50% indium. Alternatively, acceptable simple alloys of indium may also include those comprised of between about 90 and 97 weight percent indium and the balance silver. A specific example includes the alloy comprised of about 90% indium and 10% silver.

In order to prevent liquidation of the spherical preform 210 during reflow heating, the melting point of the alloy comprising the spherical preform 210 must be greater than the melting point of the alloy comprising the solder paste 312 and 314. The solder connection structure 201 can be fabricated when the difference in the melting points of the spherical preform 210 and the solder paste 312 and 314 is no smaller than about 25° C. For example, if the spherical preform 210 is comprised of the 90% indium and 10% silver alloy, which has a melting point of about 237° C., the solder connection structure 201 can be fabricated by attaching the spherical preform 210 to the faying surfaces 202 and 204 with the solder paste 312 and 314 comprised of an alloy comprised of about 63% tin and 37% lead and having a melting point of about 183° C. For ease of manufacturing, it is preferred to have a larger melting point difference to allow aggressive temperature ramp-up and adequate heating of the faying surfaces and the other components involved. This effectuates the attachment and the re-alloying of the solder paste 312 and 314 as previously mentioned and discussed further in reference to FIG. 5 below. Therefore, for example, the preferred solder connection structure 201 can be fabricated by attaching the spherical preform 210 comprised of the 95% lead and 5% indium alloy and having a melting point of about 314° C. with the solder paste comprised of the 63% tin and 37% lead alloy. In accordance with the aforementioned, the solder paste 312 and 314 may also be comprised of alloys comprised of about 62% tin, 36% lead, and 2% silver and having a melting point of about 179° C. and about 35.5% bismuth, 35% lead, 20% tin, and 9.5% cadmium and having a melting point of about 90° C. (see Manko, "Solders and Soldering," pg. 110, Table 3-16). Note that the specified melting points are directly dependent on the percentages of the constituent elements comprising the alloys of the spherical preform 210 and the solder paste 312 and 314.

In addition to suggesting plausible compositions for the spherical preform 210 and the solder paste 312 and 314, manufacturability and cost considerations must be considered to justify usage of the aforementioned alloys. In order to maintain compatibility with the manufacturing process, the solder paste 312 and 314 must consist of a solder alloy that can be used to attach all of the electronic components of the circuit board 208 (components in addition to the grid array package 206) in a one-step in-line screen printing process that typically initiates circuit board manufacturing. Because of its relatively low cost, the solder paste 312 and 314 comprised of tin and lead is typically preferred.

Although it is possible to create a fatigue resistant solder connection structure with indium in the solder paste 312 and 314 to start with, the higher cost of indium-bearing solder paste and other manufacturability concerns discourage this. Because the cost of indium greatly exceeds the cost of tin and lead and a one-step screen printing manufacturing process is desired to maintain automated assembly and prevent unnecessary cost and quality ramifications, it is practically unfeasible to utilize indium in the solder paste 312 and 314. For example, because of the high cost, an indium-bearing solder paste would only be used to attach the grid array package 206 to the circuit board 208, thus requiring an additional manufacturing step to screen print the indium-bearing solder paste onto the circuit board for attachment of the grid array package after printing tin-lead solder paste onto the rest of the circuit board 208 for the attachment of the other electronic components. In addition, an alloy solder paste containing indium has been determined to have a short shelf life due to unwanted congealing of the paste caused by the reaction of the indium with the paste chemistry.

Some of the aforementioned solder paste alloys, spherical preform alloys, and their melting points, which can be combined to form the solder connection structure 201, are listed in the Table below for clarity. In accordance with the aforementioned, the solder paste alloys in the first, the second and the third, and the fourth row may be combined with a spherical preform alloy of the fifth, the sixth, the seventh, the eighth, the ninth, or the tenth row to form the solder connection structure 201. For example, the 63% tin and 37% lead alloy comprising the solder paste of the first row can be combined with the 81% lead and 19% indium alloy comprising the spherical preform of the seventh row. Or, similarly, the 35.5% bismuth, 35% lead, 20% tin, and 9.5% cadmium alloy comprising the solder paste of the second and the third row can be combined with the 90% indium and 10% silver alloy comprising the spherical preform of the ninth row or with the 50% lead and 50% indium alloy comprising the spherical preform of the tenth row.

TABLE

| SOLDER PASTE ALLOY | SPHERICAL PREFORM ALLOY | MELTING POINT (°C.) |
|---|---|---|
| 63% Sn/37% Pb | | 183 |
| 35.5% Bi/35% Pb/ 20% Sn/9.5% Cd | | 90 |
| 62% Sn/36% Pb/2% Ag | | 179 |
| | 95% Pb/5% In | 314 |
| | 90% Pb/10% In | 300 |
| | 81% Pb/19% In | 280 |
| | 75% Pb/25% In | 264 |

TABLE-continued

| SOLDER PASTE ALLOY | SPHERICAL PREFORM ALLOY | MELTING POINT (°C.) |
|---|---|---|
| | 90% In/10% Ag | 237 |
| | 50% Pb/50% In | 209 |

Figure 4:
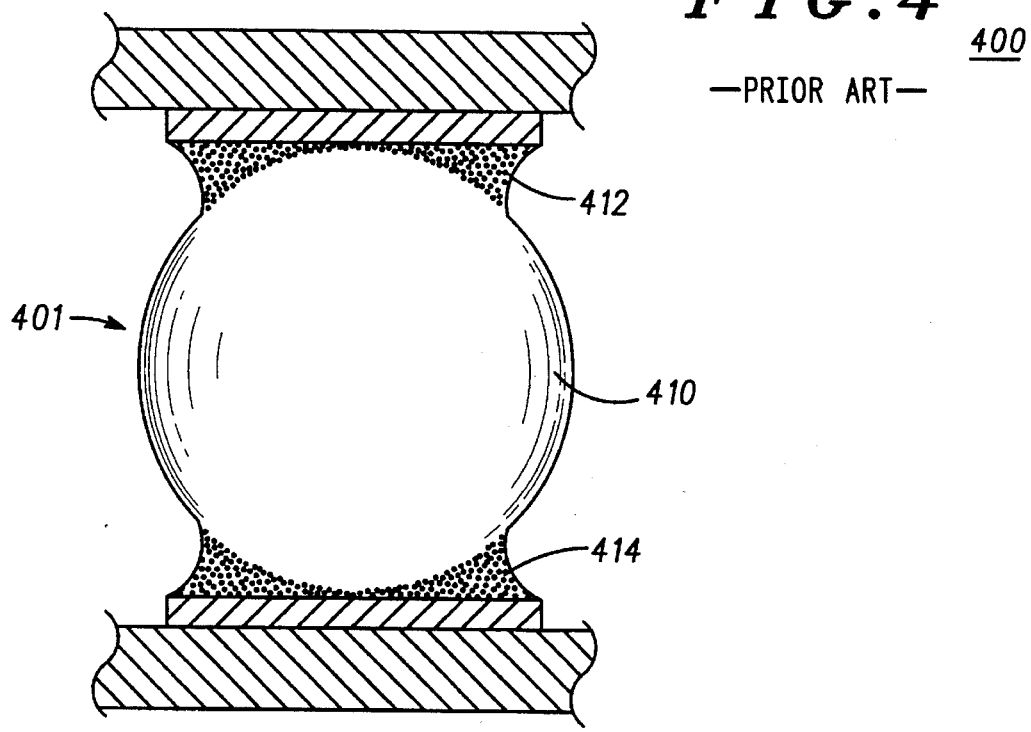
FIG. 4 illustrates a microscopic cross-sectional side view of a prior art solder connection structure.

FIG. 4 illustrates a microscopic cross-sectional side view 400 of a prior art solder connection structure 401. The microscopic side view 400 of FIG. 4 was rendered to substantially conform to microphotographs of prior art solder connection structures. This solder connection structure 401 is comprised of a spherical preform 410 disposed between the fillets 412 and 414. The spherical preform 410 of the previous solder connection structure 401 is comprised of about 90% lead and 10% tin. The fillets 412 and 414 are comprised of about 63% lead and 37% tin. Because of similar compositions, the spherical preform 410 and the fillets 412 and 414 exhibit similar stress-strain performance suggesting that this solder connection structure 401 mechanically behaves like a uniform structure. However, because of the presence of tin throughout, this solder connection structure 401 lacks the compliance to strain so as to adequately alleviate applied thermally-induced stresses. As a result, these stresses tend to accumulate within this solder connection structure 401 leading to eventual fatigue and mechanical failure.

The microscopic side view 400 reveals a distinct junction between the 90% lead and 10% tin alloy comprising the fillets 412 and 414 and the 63% lead and 37% tin alloy comprising the spherical preform 410. During reflow heating, the solder paste that subsequently solidifies to form the fillets 412 and 414 merely wets to the surfaces of the spherical preform 410. As a result, the previous solder connection structure 401 is highly susceptible to the aforementioned shear stresses.

Figure 5:
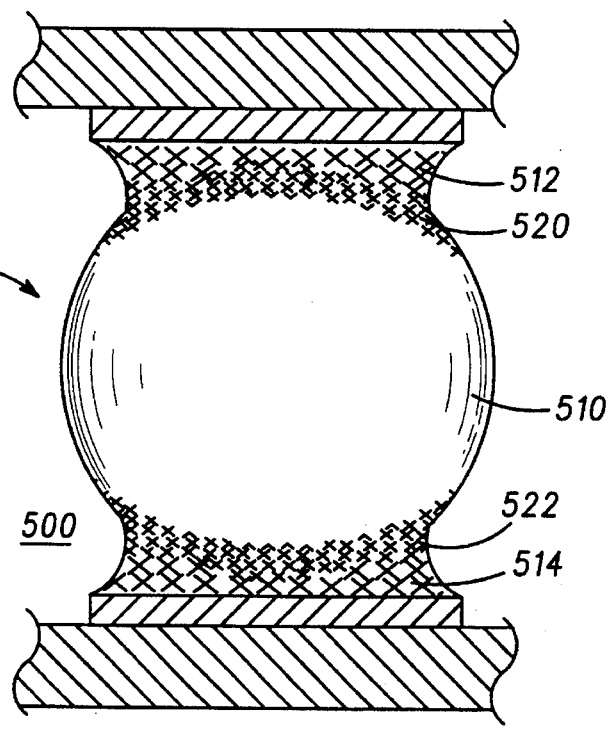
FIG. 5 illustrates a microscopic view of the solder connection structure of FIG. 2 according to the present invention.

FIG. 5 illustrates a microscopic view 500 of the solder connection structure 201 of FIG. 2 according to the present invention. The microscopic view 500 of FIG. 5 was rendered to substantially conform to microphotographs of the solder connection structure 201. The microscopic view 500 reveals a spherical preform 510 disposed between a pair of fillets 512 and 514. Rather than the distinct junction between the alloy comprising the fillets 412 and 414 and the alloy comprising the spherical preform 410 of FIG. 4, the microscopic view 500 reveals blended regions 520 and 522 disposed between the respective fillets 512 and 514 and the spherical preform 510.

The blended regions 520 and 522 result from the re-alloying of the solder paste that later solidifies to form the fillets 512 and 514. During reflow heating, the spherical preform 510 becomes slightly truncated in shape. The truncation occurs as a result of the dissolution of some of the indium comprising the spherical preform 510 into the solder paste, such as solder paste 312 and 314. The amount of the spherical preform 510 that is dissolved into the solder paste is directly proportional to the amount of the solder paste deposited on the faying surfaces during the method steps described in association with FIGS. 3-1 and 3-2.

The blended regions 520 and 522 effectuate the bonding of the less compliant fillets 512 and 514 to the compliant spherical preform 510. The blended regions 520 and 522 transfer thermally induced stresses from the less compliant fillets 512 and 514 into the compliant spherical preform 510 to permit elastic strain of the solder connection structure 501 without mechanical failure or, specifically, without shearing or detachment of the compliant spherical preform 510 from the less compliant fillets 512 and 514.

The blended regions 520 and 522 and the respective fillets 512 and 514 consist of a gradual, changing combination of material from the solder paste and the spherical preform 510. For example, reflow heating the combination of the solder paste 312 and 314 comprised of 63% tin and 37% lead and the spherical preform 510 comprised of 81% lead and 19% indium results in the blended regions 520 and 522 and respective fillets 512 and 514 having a composition of about 42% tin, 40% lead, and 18% indium. Reflow heating the solder paste 312 and 314 comprised of 62% tin, 36% lead, and 2% silver and the spherical preform 510 comprised of 81% lead and 19% indium results in the blended regions 520 and 522 and respective fillets 512 and 514 having a composition of about 42% tin, 40% lead, 18% indium, and trace amounts of silver, wherein a trace amount typically refers to less than 0.1%. The solder paste 312 and 314 comprised of 62% tin, 36% lead, and 2% silver and the spherical preform 510 comprised of 90% lead and 10% indium combine to form the blended regions 520 and 522 and respective fillets 512 and 514 having a composition of about 64% tin, 32% lead, 4% indium, and trace amounts of silver. Also, the solder paste comprised of 62% tin, 36% lead, and 2% silver and the spherical preform comprised of 95% lead and 5% indium combine to form the blended regions 520 and 522 and respective fillets 512 and 514 having a composition of about 76% tin, 22% lead, 2% indium, and trace amounts of silver. Although indium is present throughout the fillets 512 and 514, higher concentrations of indium typically will exist near as well as within the blended regions 520 and 522.

In addition, temperature cycling testing has shown that the fatigue life and reliability of solder connection structures having the aforementioned combinations of alloys in accordance with the present invention exceed that of previous solder connection structures. For example, temperature cycling from about 5° C. to 100° C. of multiples of the solder connection structure 501 fabricated from the spherical preform comprised of 81% lead and 19% indium according to the present invention revealed no failures after approximately 2,290 cycles. Similar testing of prior art solder connection structures fabricated from the spherical preform comprised of 90% lead and 10% tin revealed a first failure at 529 cycles, a second failure 1,248 cycles, and a third failure at 2,226 cycles.

Unlike the prior art solder connection structures comprised of alloys containing two distinct elements, tin and lead, the solder connection structure 501 comprises a third compliant element, indium. The compliancy and the fatigue resistance of the solder connection structure 501 exists as a result of the "sharing" of the indium between the spherical preform 510 and the fillets 512 and 514 (resulting from the aforementioned dissolution).

Although the aforementioned embodiments of the solder connection structure 501 utilize a spherical preform, it is possible to manufacture a fatigue resistant and compliant solder connection structure by using solder alloy preforms of other shapes. For example, a compliant block-shaped, barrel-shaped, or prism shaped preform is also capable of receiving and evenly distributing stresses transferred from the intermetallic layers (between the fillets and the faying surfaces) via the less compliant fillets and the blended regions.

In summary, the present invention provides a fatigue resistant solder connection for a solder connection structure. The solder connection structure, which couples the faying surfaces of two substrates, is comprised of a compliant metal alloy solder preform connectably disposed between two less compliant metal alloy solder fillets. The solder connection structure is fabricated by depositing a solder paste, which can be comprised of lead and tin, onto the faying surface of one of the substrates. The preform, which is comprised of a more compliant alloy, such as lead and indium, is placed in contact with the paste. The preform and paste are then sufficiently reflow heated, such that indium from the compliant preform dissolves into the solder paste, effectively re-alloying the solder paste. The fillet, which results from the solidified paste, is comprised of a distinct metal alloy solder mixture containing lead, tin, and indium that is different in composition from the metal alloy solders of both the preform and the solder paste. The process is then reapplied to attach the other substrate to the preform. Because the preform and the re-alloyed fillets share the indium, the solder connection structure is more compliant so as to resist fatigue and mechanical failure by reducing thermally induced, harmful shear stresses.

Although the invention has been described and illustrated in the above description and drawings, it is understood that this description is by example only and that numerous changes and modifications, such as interconnecting the faying surfaces of two substrates using only a compliant preform by heating the preform and faying surfaces to cause the compliant material from the preform to dissolve into the faying surfaces, can be made by those skilled in the art without departing from the true spirit and scope of the invention.

We claim:

1. A method of forming a melted alloy connection to a faying surface of a substrate, the method comprising the steps of:
    (a) depositing a first alloy solder having a first melting point onto the faying surface;
    (b) placing a second alloy solder formed of a material more compliant than the first alloy solder in contact with the first alloy solder, the second alloy solder having a second melting point greater than the first melting point; and
    (c) heating the first alloy solder and the second alloy solder to a temperature between the first melting point and the second melting point sufficient to dissolve the material more compliant than the first alloy solder from the second alloy solder into the first alloy solder and transform the first alloy solder into a third alloy solder that is elementally different from the first alloy solder.

2. A method of forming a melted alloy connection to a faying surface of a substrate, the method comprising the steps of:
    (a) depositing a first alloy solder having a first melting point onto the faying surface;
    (b) placing an indium alloy solder in contact with the first alloy solder, the indium alloy solder having a second melting point greater than the first melting point; and
    (c) heating the first alloy solder and the indium alloy solder to a temperature between the first melting point and the second melting point sufficient to dissolve indium from the indium alloy solder into the first alloy solder and transform the first alloy solder into a third alloy solder that is compositionally different from the first alloy solder and the indium alloy solder.

3. The method according to claim 2, wherein the first alloy solder deposited in said step (a) is substantially indium-free.

4. The method according to claim 3, wherein the third alloy solder comprises a second indium alloy solder.

5. The method according to claim 1, wherein the first alloy solder deposited in said step (a) is a paste; and wherein the second alloy solder placed in said step (b) is a preform.

6. The method according to claim 1, further comprising the step of:

(d) cooling the melted alloy connection to solidify the third alloy solder into a multiphase mixture of elements of said second alloy solder and said first alloy solder.

7. The method according to claim 1, wherein said step (c) comprises the substep of:

(c1) heating the first alloy solder and the second alloy solder to a temperature above the first melting point for about 15 seconds to about 60 seconds, wherein transforming the first alloy solder into the third alloy solder occurs between 0 seconds and about 60 seconds.

8. The method according to claim 1, wherein the first melting point is lower than the second melting point by a temperature of about 25° C. or more.

9. The method according to claim 2, wherein the first alloy solder is a material selected from a group consisting of SnPb, SnPbAg, and SnBiPbCd and the indium alloy solder is a material selected from a group consisting of InPb and InAg.

10. The method according to claim 2, wherein the first alloy solder consists of amounts of tin and amounts of lead sufficient to cause the first melting point and the indium alloy solder consists of amounts of lead and amounts of indium sufficient to cause the second melting point, the second melting point being about 25° C. or more above the first melting point.

11. The method according to claim 2, wherein the first alloy solder consists of amounts of tin and amounts of lead sufficient to cause the first melting point and the indium alloy solder consists of amounts of silver and amounts of indium sufficient to cause the second melting point, the second melting point being from about 25° C. above the first melting point.

12. The method according to claim 2, wherein the indium alloy solder comprises between about 3 and 50 weight percent indium and the balance substantially lead.

13. The method according to claim 2, wherein the first alloy solder comprises about 63% tin and 37% lead, the indium alloy solder comprises about 81% lead and 19% indium, and the third alloy solder comprises about 42% tin, 40% lead, and 18% indium.

14. The method according to claim 2, wherein the first alloy solder comprises about 63% tin and 37% lead and the indium alloy solder comprises about 75% lead and 25% indium.

15. The method according to claim 2, wherein the first alloy solder comprises about 35.5% bismuth, 35% lead, 20% tin, and 9.5% cadmium and the indium alloy solder comprises about 81% lead and 19% indium.

16. The method according to claim 2, wherein the first alloy solder comprises about 35.5% bismuth, 35% lead, 20% tin, and 9.5% cadmium and the indium alloy solder comprises about 95% lead and 5% indium.

17. The method according to claim 2, wherein the first alloy solder comprises about 35.5% bismuth, 35% lead, 20% tin, and 9.5% cadmium and the indium alloy solder comprises about 75% lead and 25% indium.

18. The method according to claim 2, wherein the first alloy solder comprises about 35.5% bismuth, 35% lead, 20% tin, and 9.5% cadmium and the indium alloy solder comprises about 50% lead and 50% indium.

19. The method according to claim 2, wherein the indium alloy solder comprises between about 90 and 97 weight percent indium and the balance substantially silver.

20. The method according to claim 2, wherein the first alloy solder comprises about 35.5% bismuth, 35% lead, 20% tin, and 9.5% cadmium and the indium alloy solder comprises about 90% indium and 10% silver.

21. The method according to claim 2, wherein the first alloy solder comprises about 62% tin, 36% lead, and 2% silver and the indium alloy solder comprises about 81% lead and 19% indium, and the third alloy solder comprises about 42% tin, 40% lead, 18% indium, and trace amounts of silver.

22. The method according to claim 2, wherein the first alloy solder comprises about 62% tin, 36% lead, and 2% silver, the indium alloy solder comprises about 90% lead and 10% indium, and the third alloy solder comprises about 64% tin, 32% lead, 4% indium, and trace amounts of silver.

23. The method according to claim 2, wherein the first alloy solder comprises about 62% tin, 36% lead, and 2% silver, the indium alloy solder comprises about 95% lead and 5% indium, and the third alloy solder comprises about 76% tin, 22% lead, 2% indium, and trace amounts of silver.

24. A method of forming a melted alloy connection to a faying surface of a substrate, the method comprising the steps of:

(a) depositing a substantially indium-free alloy solder having a first melting point onto the faying surface;

(b) placing an indium alloy solder in contact with the indium-free alloy solder, the indium alloy solder having a second melting point greater than the first melting point; and (c) heating the indium-free alloy solder and the indium alloy solder to a temperature between the first melting point and the second melting point sufficient to combine indium from the indium alloy solder into the substantially indium-free alloy solder.

25. The method according to claim 24, wherein the substantially indium-free alloy solder deposited in said step (a) is a paste; and wherein the indium alloy solder placed in said step (b) is a preform.

26. The method according to claim 25, wherein the first melting point is lower than the second melting point by a temperature of about 25° C. or more.

27. The method according to claim 25, wherein the substantially indium-free alloy deposited in said step (a) is indium-free.

* * * * *